(12) United States Patent
Huang et al.

(10) Patent No.: US 9,588,446 B2
(45) Date of Patent: Mar. 7, 2017

(54) CALIBRATION APPARATUS AND AN ADJUSTMENT METHOD FOR A LITHOGRAPHY APPARATUS

(71) Applicant: Taiwan Semiconductor Manufacturing Co., Ltd., Hsin-Chu (TW)

(72) Inventors: Chen-Yen Huang, Jhunan Township, Miaoli County (TW); Ai-Jen Hung, Zhushan Township, Nantou County (TW); Shin-Rung Lu, Chu-Pei (TW); Yen-Di Tsen, New Taipei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/725,339

(22) Filed: May 29, 2015

(65) Prior Publication Data
US 2016/0349633 A1 Dec. 1, 2016

(51) Int. Cl.
*G03B 27/54* (2006.01)
*G03B 27/68* (2006.01)
(Continued)

(52) U.S. Cl.
CPC ........ *G03F 9/7019* (2013.01); *G03F 7/70616* (2013.01); *G03F 7/70683* (2013.01); *G03F 9/7073* (2013.01)

(58) Field of Classification Search
CPC .... G03F 9/7019; G03F 9/7073–9/7092; G03F 7/70191; G03F 7/7015–7/70183; G03F 7/70141; G03F 7/70258; G03F 7/70266; G03F 7/70308; G03F 7/70516; G03F 7/70525; G03F 7/70533; G03F 7/70616; G03F 7/70633; G03F 7/70641; G03F 7/70666; G03F 7/70675; G03F 7/70683; G03F 7/70758
USPC .......... 250/492.1, 492.2, 492.22, 493.1, 548; 355/52, 53, 55, 67–75, 77; 430/5, 8, 22, 430/30, 311, 312, 321; 356/601, 609, (Continued)

(56) References Cited

U.S. PATENT DOCUMENTS

| | | | |
|---|---|---|---|
| 6,721,033 B1 * | 4/2004 | Kaneko | G03B 27/32 250/492.2 |
| 7,420,188 B2 | 9/2008 | Chang et al. | |

(Continued)

*Primary Examiner* — Christina Riddle
(74) *Attorney, Agent, or Firm* — McClure, Qualey & Rodack, LLP

(57) ABSTRACT

A calibration apparatus is provided. The calibration apparatus includes a wafer carrier configured to support a substrate with a patterned layer. The patterned layer includes a first exposure area and remaining exposure areas, and each of the first and the remaining exposure areas includes a first checking mark. The calibration apparatus also includes a measurement device configured to obtain a first exposure value of the first checking mark of the first exposure area by measuring the first checking mark of the first exposure area. The calibration apparatus also includes a processing module configured to calculate first calculated values of the first checking marks of the remaining exposure areas according to the first exposure value and a standard file. The illumination device is adjusted by an adjustment device of the lithography apparatus according to the first calculated values during a lithography process.

17 Claims, 10 Drawing Sheets

(51) Int. Cl.
*G03B 27/52* (2006.01)
*G03F 9/00* (2006.01)
*G03F 7/20* (2006.01)

(58) Field of Classification Search
USPC ....... 356/614–624, 625, 628, 630, 632, 634, 356/635, 388, 390, 394
See application file for complete search history.

(56) References Cited

U.S. PATENT DOCUMENTS

| | | |
|---|---|---|
| 8,889,434 B2 | 11/2014 | Tsen et al. |
| 2006/0256306 A1 | 11/2006 | Lin et al. |
| 2007/0165938 A1* | 7/2007 | Matsumura ...... G01N 21/95607 382/144 |
| 2013/0229638 A1 | 9/2013 | Chen et al. |

* cited by examiner

CALIBRATION APPARATUS AND AN ADJUSTMENT METHOD FOR A LITHOGRAPHY APPARATUS

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a wafer, and patterning the various material layers using a lithography process to form circuit components and elements thereon. Many integrated circuits are typically manufactured on a single wafer, and individual dies on the wafer are singulated by sawing between the integrated circuits along a scribe line. The individual dies are typically packaged separately, in multi-chip modules, or in other types of packaging, for example.

In the lithography process, a photoresist is applied to a wafer, and the photoresist is exposed and developed to form a pattern in the semiconductor manufacturing process. These developed patterns now have very fine detail, and some issues may cause unsatisfactory defects in the developed photoresist during the lithography process.

Although existing devices for a lithography apparatus have been generally adequate for their intended purposes, they have not been entirely satisfactory in all respects. Consequently, it would be desirable to provide a solution for improving the quality of the photoresist of the wafer during the lithography process.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1:
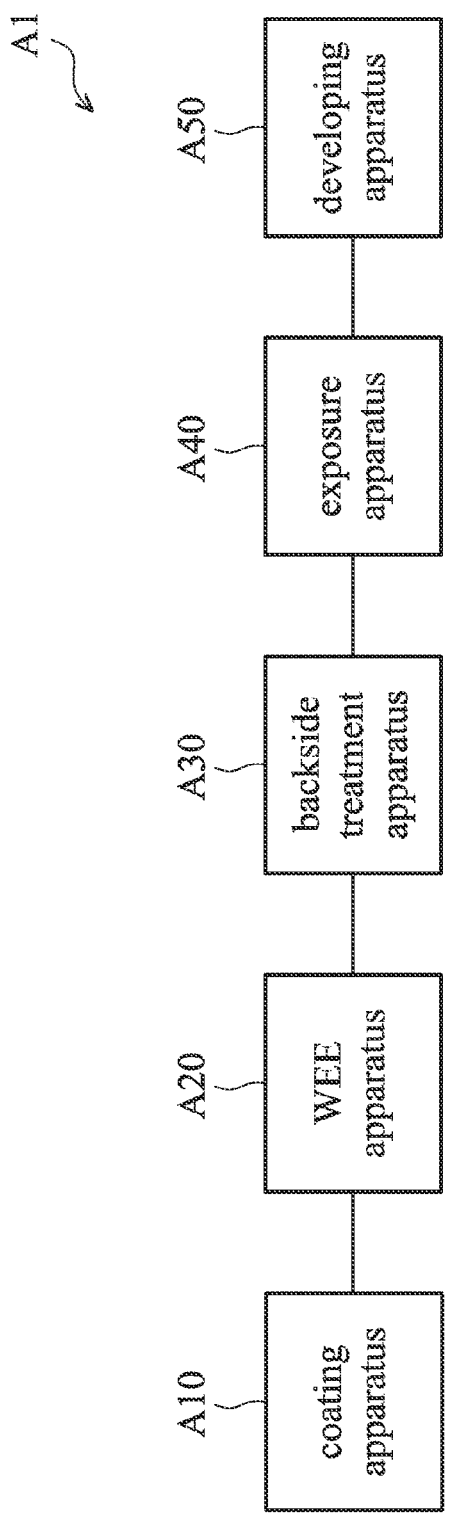
FIG. 1 is a schematic view of a lithography apparatus in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

A calibration apparatus and an adjustment method are provided. The calibration apparatus is configured to adjust the illumination device of a lithography apparatus according to a measuring result of a wafer. According to the present disclosure, the time required for measuring the wafer is decreased. Therefore, the measurement of the wafer for adjusting of the illumination device can be processed more frequently. The defects of the wafers are decreased, and the yield rate of wafers is improved.

FIG. 1 is a schematic view of a lithography apparatus A1 in accordance with some embodiments of the disclosure. In some embodiments, the lithography apparatus A1 is an immersion lithography apparatus. The lithography apparatus A1 includes a number of apparatuses, such as a coating apparatus A10, a WEE (wafer-edge exposure) apparatus A20, a backside treatment apparatus A30, an exposure apparatus A40, and a developing apparatus A50.

The coating apparatus A10 is configured to coat a photoresist on a wafer by a coating process. The wafer is transmitted to the WEE apparatus A20 after the coating process.

The WEE apparatus A20 is configured to remove the photoresist at the edge of the wafer by a WEE process. Afterward, the wafer is transmitted to the backside treatment apparatus A30 after the WEE process. The backside treatment apparatus A30 is configured to clean the backside of the wafer by a backside cleaning process.

The wafer is transmitted to the exposure apparatus A40 after the backside cleaning process. The exposure apparatus A40 is configured to form a pattern on the photoresist by an exposure process. Finally, the wafer is transmitted to the developing apparatus A50 after the exposure process. The developing apparatus A50 is configured to develop a resist pattern to the exposed photoresist by a developing process. Afterwards, the wafer is transmitted to another semiconductor apparatus, such as an etching apparatus or a chemical vapor deposition (CVD) apparatus.

Figure 2A:
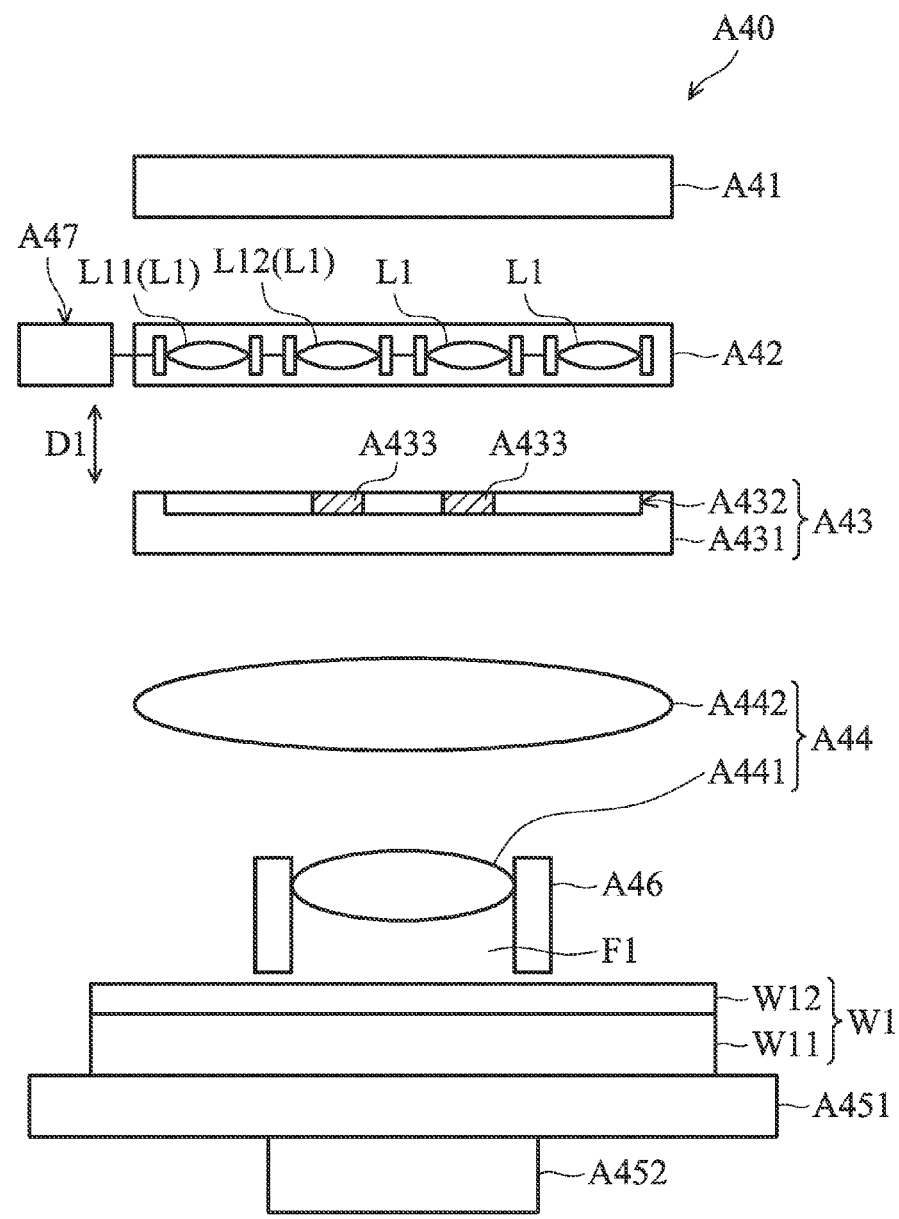
FIGS. 2A to 2C are schematic views of an exposure apparatus during an intermediate stage of an exposure process in accordance with some embodiments of the disclosure.
Figure 2B:
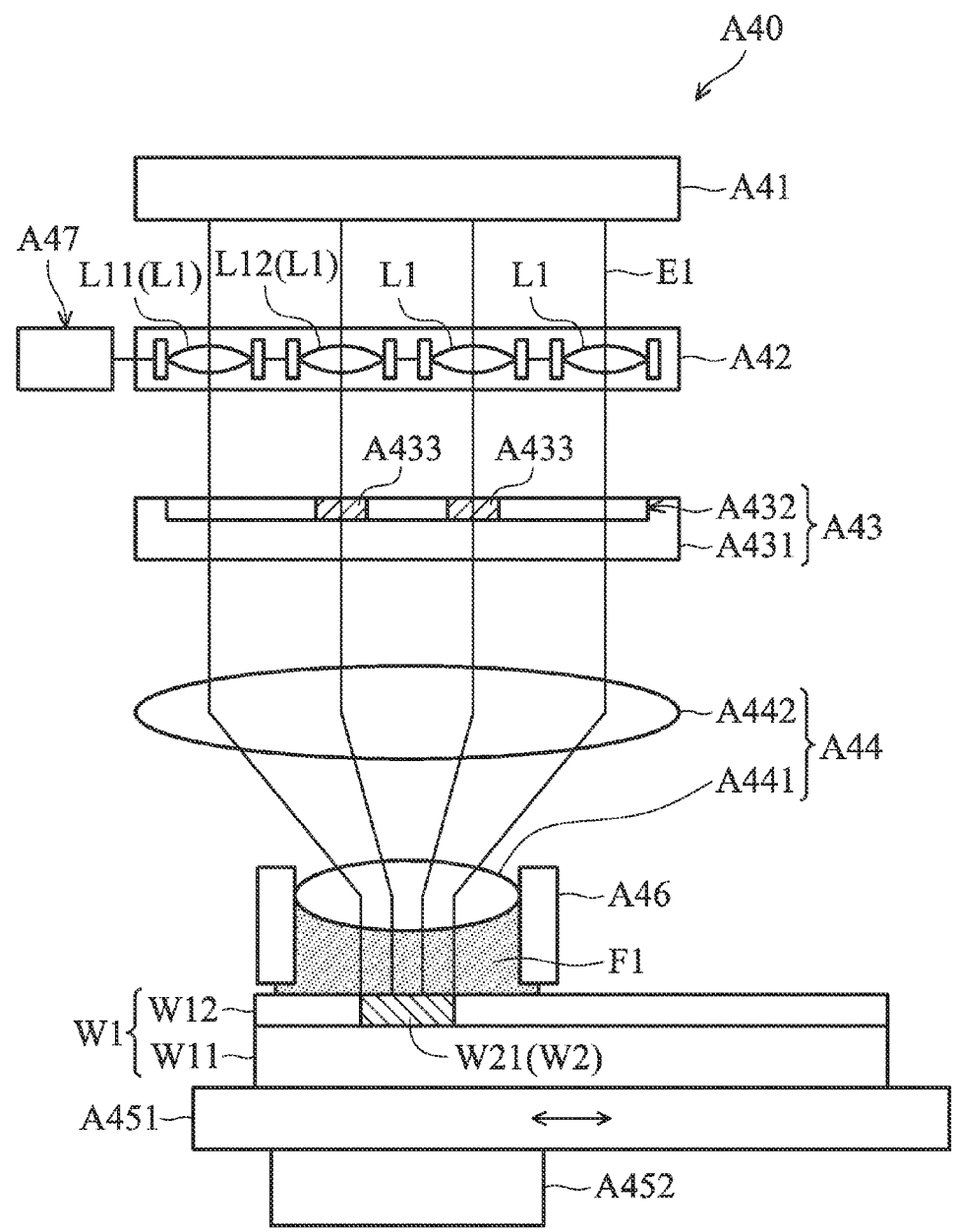
Figure 2C:
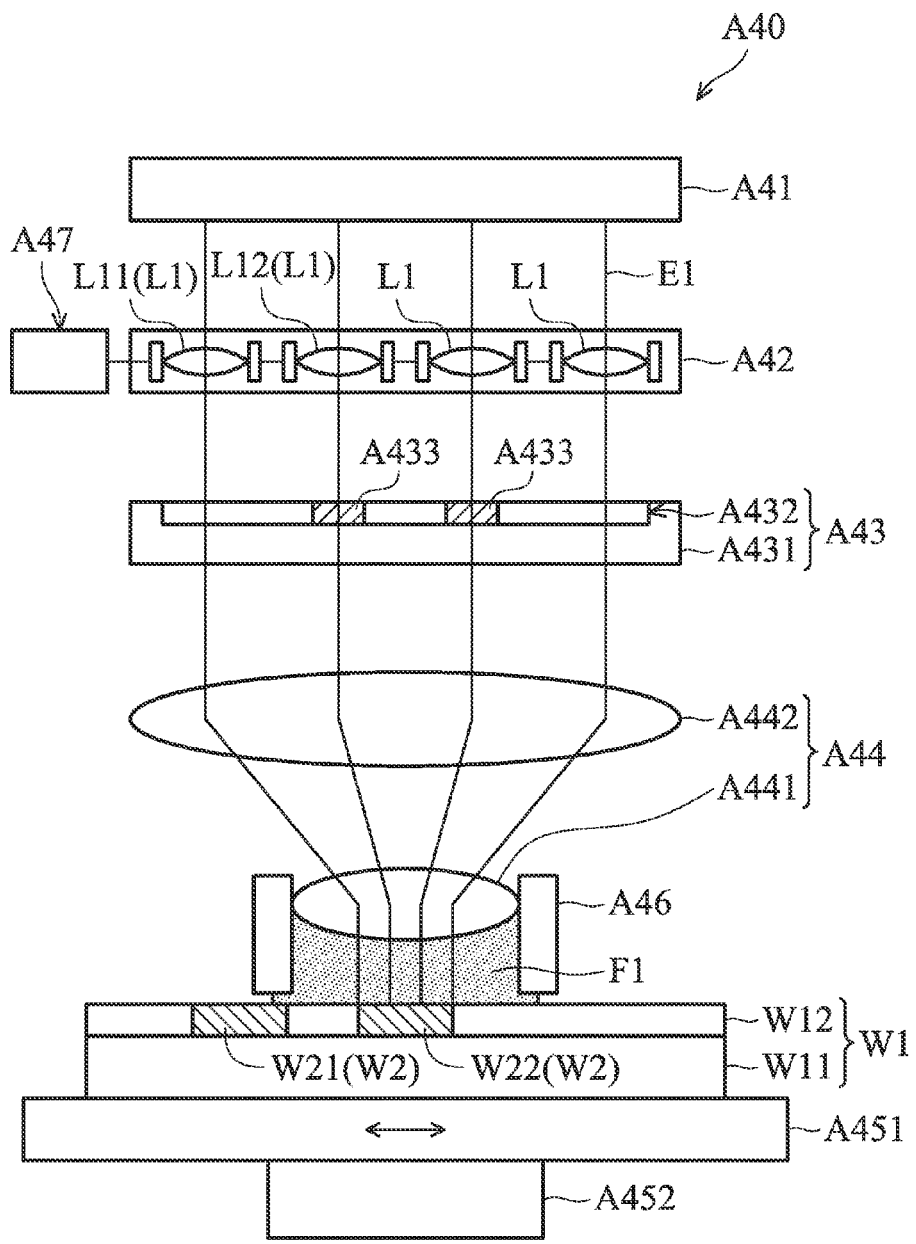

FIGS. 2A to 2C are schematic views of the exposure apparatus A40 during an intermediate stage of an exposure process in accordance with some embodiments of the disclosure. The exposures apparatus A40 includes a light source A41, an illumination device A42, a photomask A43, an objective lens module A44, a wafer carrier A45, and a fluid retaining device A46. The light source A41 is located over the illumination device A42. The light source A41 is configured to emit a light beam E1 to the illumination device A42.

In some embodiments, the light source A41 is a mercury lamp having a wavelength of about 436 nm (G-line) or about 365 nm (I-line), a Krypton Fluoride (KrF) excimer laser with wavelength of about 248 nm, an Argon Fluoride (ArF) excimer laser with a wavelength of about 193 nm, a Fluoride ($F_2$) excimer laser with a wavelength of about 157 nm, or other light source having a desired wavelength (e.g., below approximately 100 nm).

It should be understood that in the above description of light sources, each light source may have a certain wavelength distribution, or line width, rather than an exact single wavelength. For example, the I-line (e.g., 365 nm) wavelength of the mercury lamp may not be exactly 365 nm, but may be centered at approximately 365 nm with a range of varying wavelengths extending above and below 365 nm. This range may be used to determine a minimum possible line width during photolithography, with less variation from the desired 365 nm wavelength resulting in a thinner line width.

The illumination device A42 is located between the light source A41 and the photomask A43. In some embodiments, the illumination device A42 is a condenser device. The illumination device A42 is configured to condense the light beam E1 to the photomask A43.

The illumination includes a single lens or a lens assembly having multiple lenses and/or other lens components. For example, the illumination device A42 may include microlens arrays, shadow masks, and/or other structures designed to aid in directing light from the light source A41 onto the photomask A43. In some embodiments, the illumination device A42 includes adjusting lenses L1 arranged in an array.

The photomask A43 is located between the illumination device A42 and the wafer carrier A45. In some embodiments, the photomask A43 is located between the illumination device A42 and the objective lens module A44. The photomask A43 is configured to partially mask the light beam E1, and form a pattern on a wafer W1. The photomask A43 is replaceable in the exposure apparatus A40 for forming different patterns on different wafers.

The photomask A43 is referred to as a mask or a reticle. The photomask A43 includes a transparent substrate A431 and a patterned absorption layer A432 disposed on the transparent substrate A431. A light beam E1 is partially or completely blocked when hitting an absorption region A433 of the patterned absorption layer A432.

The objective lens module A44 is located between the wafer carrier A45 and the photomask A43. The objective lens module A44 is configured to condense the light beam E1 to the wafer W1. In some embodiments, the objective lens module A44 includes a single objective lens or a number of objective lens A441 and A442.

The wafer carrier A45 is located under the photomask A43 and the objective lens module A44. The wafer carrier A45 is configured to hold the wafer W1.

In some embodiments, the wafer W1 includes a substrate W11 and a photoresist layer W12. The photoresist layer W12 is coated on the substrate W11 by a coating process. The photoresist layer W12 is responsive to an exposure process for creating patterns. The photoresist layer W12 includes a positive photoresist or a negative photoresist.

The wafer carrier A45 includes a wafer chuck A451, a moving mechanism A452. The wafer chuck A451 is configured to hold the wafer W1. In some embodiments, the wafer chuck A451 is an electrostatic chuck. The moving mechanism A452 is configured to move the wafer chuck A451 in a translational manner, and to rotate the wafer chuck A451. Therefore, the wafer W1 is capable of moving in translational and rotational modes so that the wafer W1 can be aligned with the photomask A43.

The fluid retaining device A46 is located between the photomask A43 and the wafer carrier A45 (or the wafer W1). The fluid retaining device A46 is configured to hold immersion fluid F1.

During a lithography process, the fluid retaining device A46 is adjacent to the wafer W1. In some embodiments, the fluid retaining device A46 is surrounding the objective lens module A44 and is designed for other functions, in addition to holding the immersion fluid F1. The fluid retaining device A46 and the objective lens module A44 make up (at least in part) an immersion head.

The immersion fluid F1 is dispensed between the objective lens A441 and the wafer W1 extending to substantial bottom surface of the objective lens A441 or the substantial top surface of the wafer W1. In some embodiments, the immersion fluid F1 is only extended to cover one exposure area during a step-repeat or a step-scan exposing process. The immersion fluid F1 is configured to decrease the wavelength of the light beam E1. Therefore, a more detailed and precision pattern can be formed on the wafer W1.

In some embodiments, the immersion fluid F1 may include water (water solution or de-ionized water-DIW), high n fluid (n is index of refraction, the n value here is larger than 1.44), or conductive immersion fluid F1 such as solutions of carbon dioxide in water (carbonic acid, carbon dioxide water, or $CO_2$ water) that contain small amounts of $H_2CO_3$. Other examples of a conductive fluid may include buffer, acid, base, salt, and surfactant.

Since the conductive fluid is utilized as an immersion fluid, the electrostatic charge accumulated during the exposure process can be eliminated and therefore the particles and pattern defects caused thereby are reduced or eliminated as well.

Figure 3:
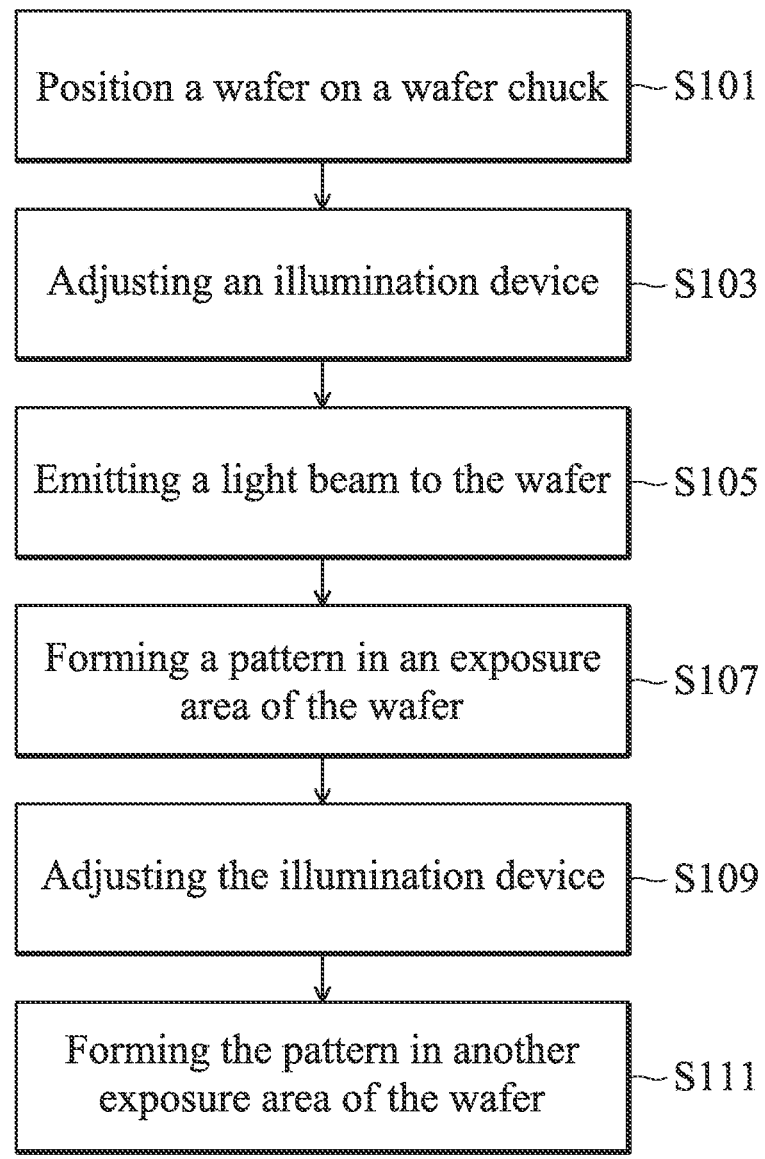
FIG. 3 is a flow chart of an exposure method in accordance with some embodiments of the disclosure.

FIG. 3 is a flow chart of an exposure method in accordance with some embodiments of the disclosure. In step S101, the wafer W1 is positioned and held on the wafer chuck A451 as shown in FIG. 2A, and the moving mechanism A452 moves the wafer chuck A451 to a position, as shown in FIG. 2B, corresponding to the exposure area W21 of the photoresist layer W12. Afterwards, the immersion fluid F1 is filled into the fluid retaining device A46 as shown FIG. 2B.

In S103, the adjusting device A47 adjusts each of the adjusting lenses L1 of the illumination device A42 for the exposure area W21 of the photoresist layer W12. Due to the adjustments of the adjusting lenses L1, the patterns formed on the photoresist layer W12 are accurate and precise.

In some embodiments, the adjusting device A47 respectively moves the adjusting lens L1 along a vertical direction D1. In some embodiments, the adjusting device A47 respectively moves the adjusting lens L1 along a horizontal plane.

In some embodiments, the adjusting device A47 rotates the adjusting lens L1 to be inclined relative to a horizontal plane.

In step S105, the light source A41 emits a light beam E1 to the wafer W1. In some embodiments, the light beam E1 passes through the adjusting lenses L1, the photomask A43, the objective lens module A44, and the immersion fluid F1 in sequence, and falls on one exposure area W2 of the photoresist layer W12. The wavelength of the light beam E1 is decreased when the light beam E1 passes through the immersion fluid F1. Therefore, a more detailed and precision pattern can be formed on the wafer W1.

In step S107, after the light beam E1 falls on the exposure area W21 of the photoresist layer W12 as shown in FIG. 2B, and a pattern corresponding to the pattern of the photomask A43 is formed in the exposure area W21.

After the pattern is formed in the exposure area W21, the moving mechanism A452 moves the wafer chuck A451 to another position corresponding to an exposure area W22 as shown in FIG. 2C.

However, the thickness of the exposure area W21 may be different from the thickness of the exposure area W22. Moreover, the fluid retaining device A46 is heated during the light beam E1 falling on the exposure area W21. The heat and the density distributions of the immersion fluid F1 over the exposure area W22 as shown in FIG. 2C are different from the heat and the density distributions of the immersion fluid F1 over the exposure area W21 are as show in FIG. 2B.

Therefore, the pattern formed on the exposure area W22 is deformed, rotated and/or shifted relative to the pattern formed on the exposure area W21 if the positions of the adjusting lenses L1 are not respectively adjusted for the exposure area W22.

In step S109, the adjusting device A47 adjusts each of the adjusting lenses L1 of the illumination device A42 for an exposure area W22 on the photoresist layer W12.

In step S111, after the light beam E1 falls on the exposure area W22 of the photoresist layer W12 as shown in FIG. 2B, and a pattern is formed in the exposure area W22. In addition, the step S109 and the step S111 are processed repeatedly until a pattern array including a number of patterns is formed on the photoresist layer W12 (referred to a patterned layer W13 as shown in FIG. 4).

By the adjustment of the adjusting lenses L1, the patterns formed on the exposure areas W2 may not deformed, rotated and/or shifted, and the quality of the pattern in the exposure areas W2 may be great. However, after many wafers are processed by the exposure apparatus A40, the setting of mechanisms the exposure apparatus A40 may be changed. The quality of some of the patterns in the exposure areas W2 is decreased after many wafers are processed. Therefore, the illumination device A42 needs to be accurately calibrated and adjusted frequently.

Figure 4:
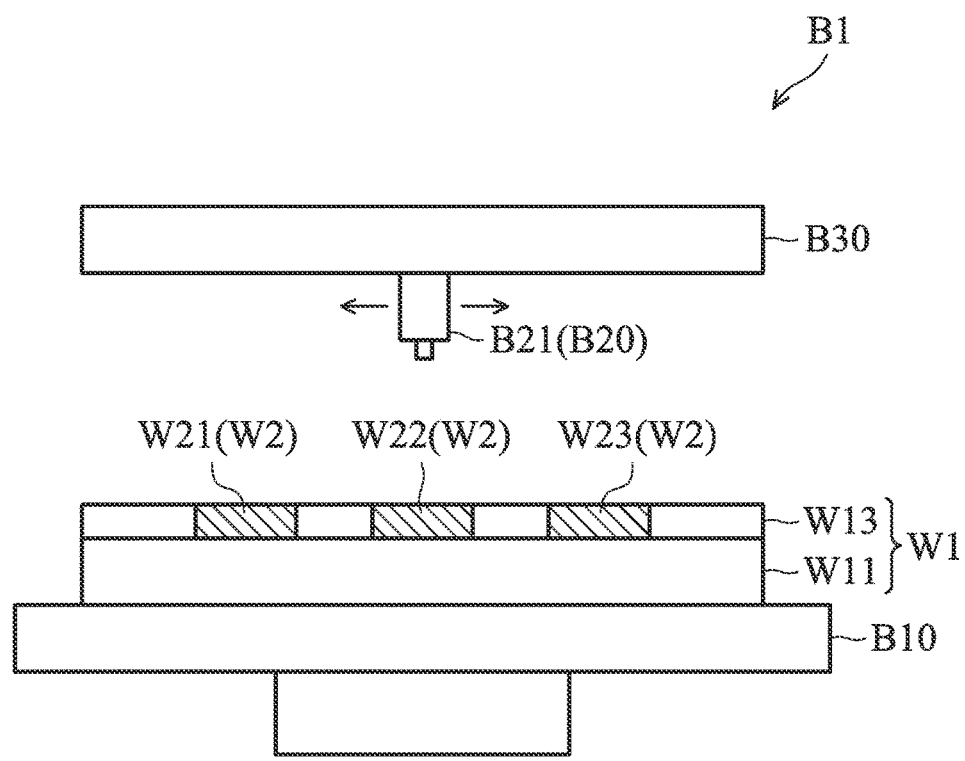
FIG. 4 is a schematic view of a calibration apparatus in accordance with some embodiments of the disclosure.
Figure 5:
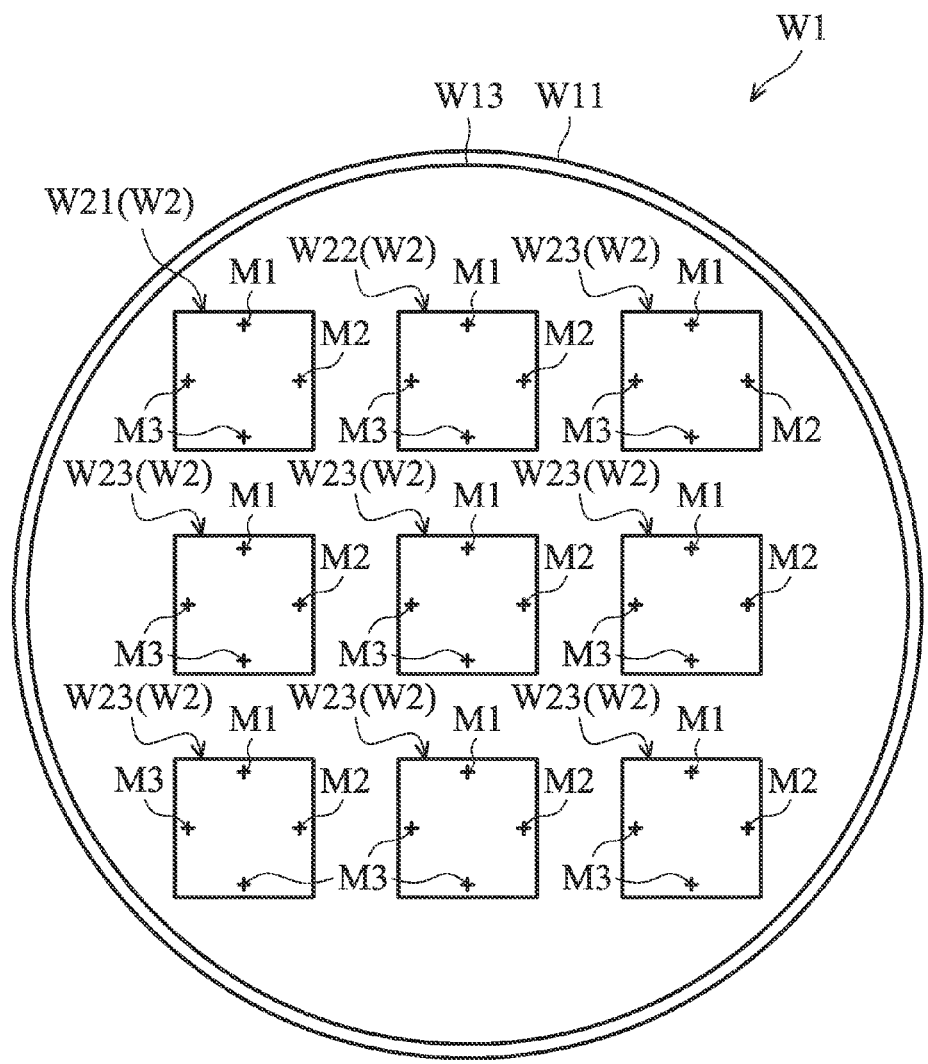
FIG. 5 a top view of a wafer in accordance with some embodiments of the disclosure.

FIG. 4 is a schematic view of a calibration apparatus B1 in accordance with some embodiments of the disclosure. FIG. 5 a top view of the wafer W1 in accordance with some embodiments of the disclosure. The calibration apparatus B1 includes a wafer carrier B10, a measurement device B20, a moving device B30, a database B40, and a processing module B50.

The wafer carrier B10 is configured to support the wafer W1. The wafer W1 is exposed by the exposure process. The wafer W1 includes the substrate W11 with the patterned layer W13. The patterned layer W13 includes the exposure areas W2 arranged in an array. Each of the exposure areas W2 shows a pattern corresponding to the pattern of the photomask A43. For the purpose of clarity, the patterns of the exposure areas W2 are not shown in figures.

In some embodiments, the number of exposure areas W2 is in a range from about 9 to about 600. In some embodiments, the number of exposure areas W2 is in a range from about 30 to about 300.

Each of patterns of the exposure areas W2 includes checking marks, such as first checking marks M1, M2, and M3, formed by the exposure process. The positions of the first checking marks M1 (M2 or M3) in each of the exposure areas W2 are substantially the same. However, tolerances between the positions of the first checking marks M1 (M2 or M3) in each of the exposure areas W2 may exist.

In some embodiments, the number of checking marks is in a range from about 2 to about 100. In some embodiments, the number of checking marks is in a range from about 4 to about 50. In some embodiments, each of the exposure areas W2 includes one first checking mark M1, one second checking mark M2, and checking marks M3.

In some embodiments, the shapes of the checking marks are cross shapes as shown in FIG. 5, or other suitable shapes. In some embodiments, the checking marks are located adjacent to the edges of the exposure areas W2 as shown in FIG. 5, or otherwise suitably located.

The measurement device B20 is configured to measure the checking marks of each of the exposure areas W2, and obtain exposure values of the checking marks. In some embodiments, the measurement device B20 includes an image device B21, such as a camera configured to take an image of each of the checking marks. The image device B21 is located over the wafer W1 during a measuring process.

The measurement device B20 analyzes each of the checking marks from the corresponding images. Afterwards, the measurement device B20 obtains an exposure value according to the result of analyzing the checking mark from the image, and the position of the image device B21 taking the image.

In some embodiments, the exposure value includes the coordinate of the checking mark in the exposure area W2. In some embodiments, each of the exposure values includes the deformation amount, the rotating amount, shift amount and/or the size of the checking mark.

In some embodiments, the exposure values include first exposure values and second exposure values. The first exposure values are obtained by measuring the first checking marks M1 of the exposure area W2. The second exposure values are obtained by measuring the checking marks M2 of the exposure area W2.

The moving device B30 is disposed over the wafer chuck A451. The moving device B30 is configured to move the image device B21 of the measurement device B20. In some embodiments, the moving device B30 is configured to move the image device B21 in a horizontal plane. In some embodiments, the moving device B30 is configured to move the image device B21 over each of the exposure areas W2 one by one.

Figure 6:
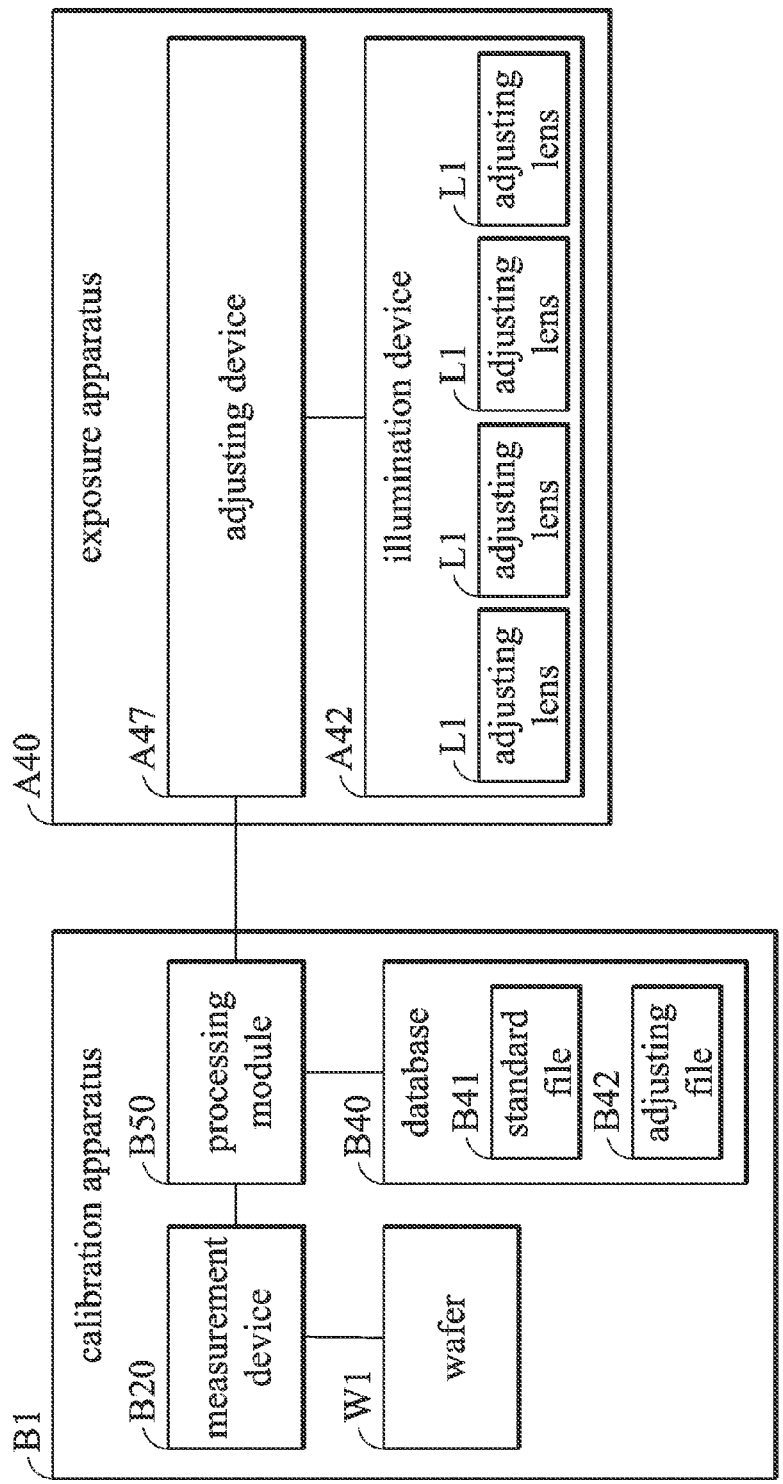
FIG. 6 is a system diagram of the calibration apparatus and the exposure apparatus in accordance with some embodiments of the disclosure.

FIG. 6 is a system diagram of the calibration apparatus B1 and the exposure apparatus A40 in accordance with some embodiments of the disclosure. The database B40 is configured to store a standard file B41 and an adjusting file B42. The standard file B41 includes a number of standard values.

The processing module B50 is electrically connected to the measurement device B20, the database B40, and the adjusting device A47. In some embodiments, the processing module B50 is a computer. In some embodiments, the processing module B50 is integrated with the measurement device B20 and/or the database B40 in one device.

The processing module B50 is configured to receive the exposure values of the checking marks from the measurement device B20, and receive the standard file B41 from the database B40. The processing module B50 is also configured to generate the adjusting file B42 according to the exposure values and the standard file B41.

The adjusting device A47 is configured to adjust each of the adjusting lenses L1 according to the adjusting file B42. In some embodiments, the adjusting device A47 receives the adjusting file B42 from the database B40 or the processing module B50, and adjusts each of the adjusting lenses L1 according to the adjusting file B42. In some embodiments, the processing module B50 controls the adjusting device A47 to adjust each of the adjusting lenses L1 according to the adjusting file B42.

Figure 7:
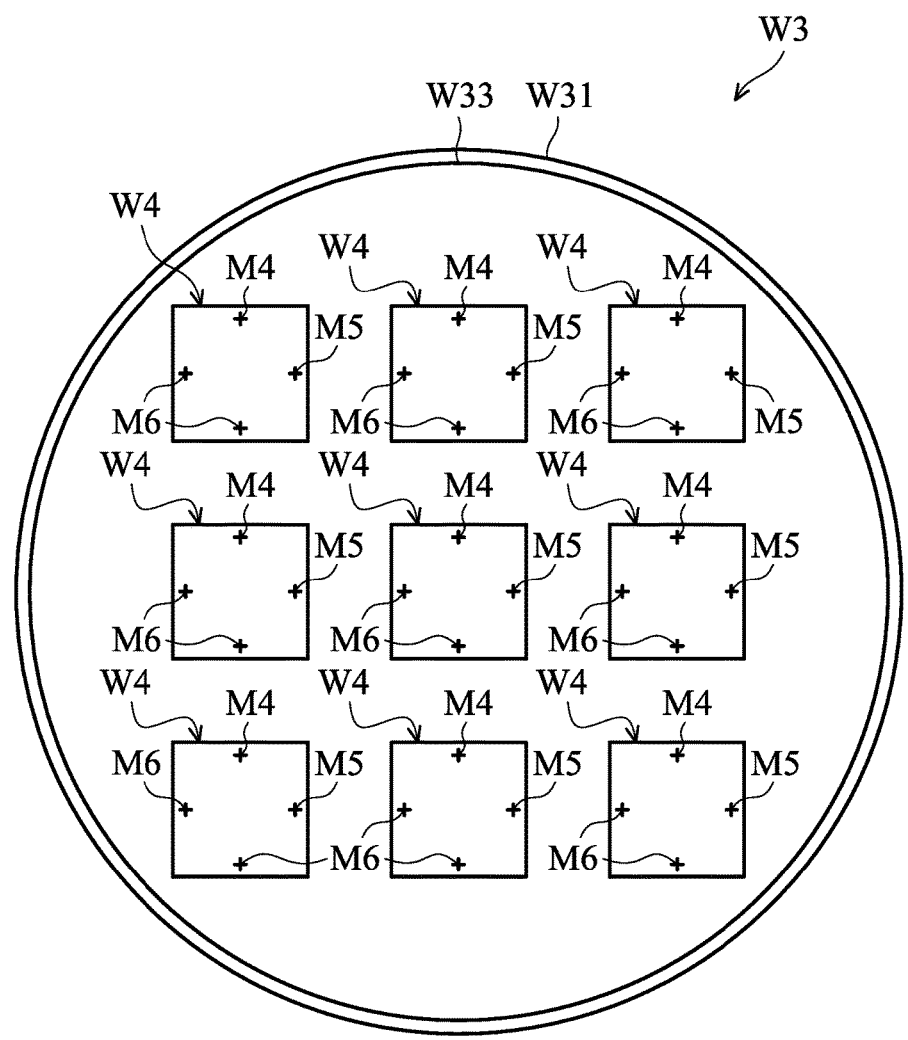
FIG. 7 a top view of a standard wafer in accordance with some embodiments of the disclosure.

FIG. 7 a top view of a standard wafer in accordance with some embodiments of the disclosure. Before the adjustment process starts to process, the calibration apparatus B1 performs a standard measuring process on the standard wafer W3 to generate a standard file B41. The standard wafer W3 is processed by the exposure apparatus A40 prior to the wafer W1, as shown in FIG. 2A. The exposure apparatus A40 performs the same exposure process on the standard wafer W3 and the wafer W1 with the some photomask A43.

As shown in FIG. 7, the standard wafer W3 includes substrate W31, and the patterned layer W33. The patterned layer W33 includes exposure areas W4. The exposure areas W4 includes a number of checking marks (as referred to standard marks M4, M5, and M6).

The exposure apparatus A40 performs the same exposure process on the standard wafer W3 and the wafer W1 with the some photomask A43. Therefore, the number of exposure areas W4 of the standard wafer W3 is the same as the number of exposure areas W2 of the wafer W1. Each of the standard marks corresponds to one of the checking marks. The number of standard marks in each of the exposure areas W4 is the same as the number of checking marks in each of the exposure areas W2. The positions and sizes of the exposure areas W4 and the standard marks are substantially the same as the positions and sizes of the exposure areas W2 and the checking marks.

The measurement device B20 measures all of the standard marks of the exposure areas W4 of the standard wafer W3 to obtain the standard values. In other words, each of the standard values corresponds to one of the standard marks. In some embodiments, the processing module B50 receives the standard values to form the standard file B41, and stores the standard file B41 in the database B40.

Afterwards, each of the adjusting lenses L11 is adjusted by the adjustment device A47 for each of the exposure areas of the wafers according to the standard values of each of the exposure areas W4 during the exposure process.

In some embodiments, each of the standard values includes the coordinate of the standard mark in the exposure area W4. In some embodiments, each of the standard values includes the deformation amount, the rotating amount, shift amount and/or the size of the standard marks, as the checking marks.

In some embodiments, the standard marks include first standard marks M4, second standard marks M5, and standard marks M6. Each of the exposure areas W4 includes one first standard mark M4, one second standard mark M5, and a number of standard marks M6. In addition, each of the first standard marks M4 corresponds to one of the first checking marks M1, and each of the second standard marks M5 corresponds to one of the second checking marks M2. Each of the standard marks M6 corresponds to one of the checking marks M3.

In some embodiments, the standard values include the first standard values and second standard values. The first standard values are obtained by measuring the first standard marks M4 of the exposure area W4. The second standard values are obtained by measuring the second standard marks M5 of the exposure area W4. In addition, each of the first standard values corresponds to one of the first checking marks M1, and each of the second standard values corresponds to one of the second checking marks M2, since the wafer W1 and the standard wafer W3 are exposed by the same photomask A43 and the same exposure process.

Figure 8:
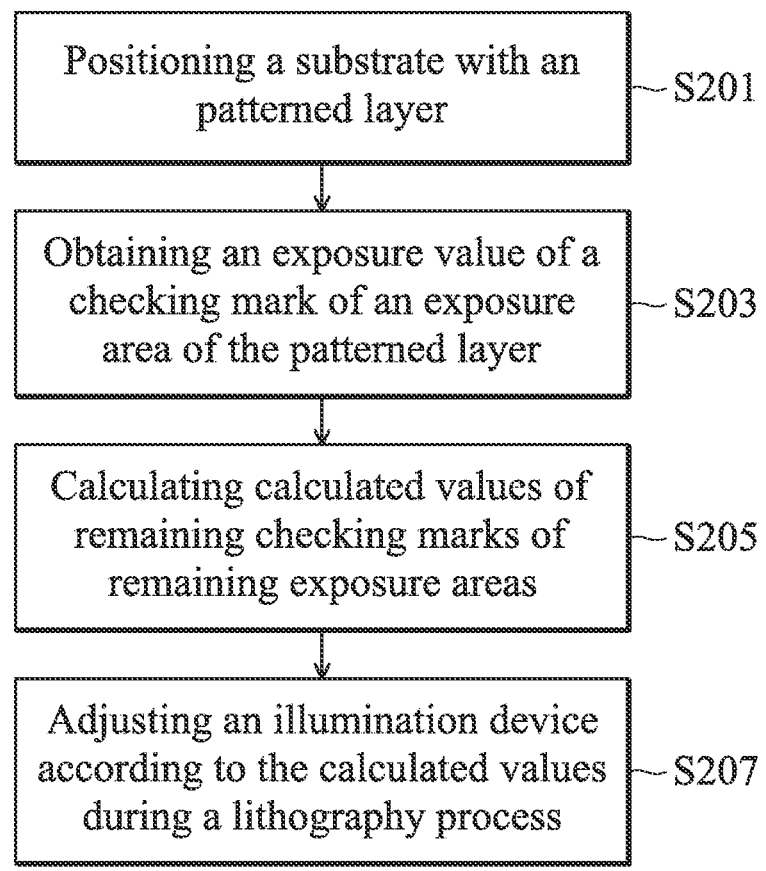
FIG. 8 is a flow chart of an adjustment method in accordance with some embodiments of the disclosure.

FIG. 8 is a flow chart of an adjustment method in accordance with some embodiments of the disclosure. In step S201, the calibration apparatus B1 performs a measuring process on the wafer W1. The substrate W11 with the patterned layer W13 is positioned onto the wafer carrier B10.

As shown in FIG. 5, the exposure areas W2 includes an exposure area W21, an exposure area W22, and a number of exposure areas (remaining exposure areas) W23. Each of the exposure areas W21, W22, and W23 include one first checking mark M1, one second checking mark M2, and a number of checking marks M3.

In step S203, the measurement device B20 obtains the first exposure value of the first checking mark M1 of the exposure area W21 by measuring the first checking mark M1 of the exposure area W21.

In step S205, the processing module B50 calculates a number of calculated values of the checking marks by a calculating process. In some embodiments, the processing module B50 calculates first calculated values of the first checking marks M1 of the remaining exposure areas W23 according to the first exposure value of the exposure area W21 and the first standard values of the standard file B41 corresponding to the remaining exposure areas W23.

Moreover, the processing module B50 calculates the first calculated value of the first checking mark M1 of the exposure area W22 according to the first exposure value of the exposure area W21 and the first standard value of the standard file B41 corresponding to the exposure area W22.

In some embodiments, the calculating process includes calculating a first difference value. The first difference value is obtained by the first exposure value minus the first standard value, which corresponds to the first checking mark M1 of the exposure area W21.

Each of the first calculated values corresponding to the remaining exposure areas W23 is obtained by the first difference value plus one of the first standard values, which corresponds to the first checking marks M1 of the remaining exposure areas W23. Moreover, the first calculated value corresponding to the exposure area W22 is obtained by the first difference value plus the first standard value, which corresponds to the first checking mark M1 of the exposure area W22.

In some embodiments, at least two first exposure values are obtained by measuring the exposure area W21 and at least one of the exposure areas W23. Therefore, at lest two first difference values can be obtained according the steps S203 and S205. Each of the first calculated values corresponding to the remaining exposure areas W23 is obtained by the average of the first difference values plus one of the first standard values, which corresponds to the first checking marks M1 of the remaining exposure areas W23.

The steps S203 and S205 are repeatedly processed until the calculated values of all of the checking marks, which are not measured by the measurement device B20, are calculated.

In some embodiments, the measurement device B20 obtains the second exposure value of the second checking mark M2 of the exposure area W22 by measuring the second checking mark M2 of the exposure area W22. The processing module B50 calculates second calculated values of the second checking marks M2 of the exposure area W21 and the remaining exposure areas W23 according to the second exposure value and the second standard values of the standard file B41.

In some embodiments, the calculating process includes calculating a second difference value. The second difference value is obtained by the second exposure value minus the second standard value, which corresponds to the second checking mark M2 of the exposure area W22.

Each of the second calculated values corresponding to the remaining exposure areas W23 is obtained by the second difference value plus one of the second standard values corresponding to the second checking marks M2 of the remaining exposure areas W23. Moreover, the second calculated value corresponding to the exposure area W21 is obtained by the second difference value plus the second standard value, which corresponds to the second checking mark M2 of the exposure area W21.

In some embodiments, the calculating process is processed according to a mathematic function. In some embodiments, the mathematic function is a Zernike Polynomials.

Therefore, only one or some checking marks of each of the exposure areas W2 of the wafer W1 needs to be measured by the measuring process for generating the adjusting file B42. The time required for measuring the wafer W1 is decreased. For example, only nine checking marks need to be measured instead of 36 checking marks, as shown in FIG. 5.

Moreover, the time required for the measuring process is much less than the time required for standard measuring process, since all of the standard marks of the standard wafer W3 needs to be measured for generating the standard file B41. In some embodiments, the time required for the standard measuring process is about 4 times to about 50 times the measuring process. Therefore, the measuring process can processed frequently than the standard measuring process.

In some embodiments, the measuring process is processed after about 100 to about 200 wafers are processed by the exposure apparatus A40. The standard measuring process is processed after about 1000 to about 2000 wafers are processed by the exposure apparatus A40.

In step S207, the illumination device A42 is adjusted by the adjustment device A47 according to the calculated values during the lithography process. In some embodiments, the processing module generates an adjusting file B42 including the calculated values. The adjustment device A47 adjusts the illumination device A42 according to the adjusting file B42. In some embodiments, the processing module controls the adjustment device A47 to adjust the illumination device A42 according to the adjusting file B42.

In some embodiments, the adjusting lens L11 is adjusted by the adjustment device A47 according to the first calculated values of the adjusting file B42 during the lithography process. The adjusting lens L12 is adjusted by the adjustment device A47 according to the second calculated values of the adjusting file B42 during the lithography process For example, as shown in FIG. 2B, another wafer W1 is processed by the lithography process. Each of the adjusting lenses L1 is adjusted according to the calculated values corresponding to the checking marks M1, M2 and M3 of the exposure area W21. As shown in FIG. 2C, each of the adjusting lenses L1 is adjusted according to the calculated values corresponding to the checking marks M1, M2 and M3 of the exposure area W22.

Embodiments of a calibration apparatus and method are provided. An illumination device of a lithography apparatus is adjusted according to a measuring result of a wafer. Since only one or some checking marks of each of the exposure areas of the wafer needs to measured, the time required for measuring the wafer is decreased. Therefore, the measuring process for adjusting of the illumination device can be processed more frequently, and the yield rate of wafers is improved.

In some embodiments, a calibration apparatus for adjusting an illumination device of a lithography apparatus is provided. The calibration apparatus includes a wafer carrier configured to support a substrate with a patterned layer. The patterned layer includes a first exposure area and remaining exposure areas, and each of the first and the remaining exposure areas includes a first checking mark. The calibration apparatus also includes a measurement device configured to obtain a first exposure value of the first checking mark of the first exposure area by measuring the first checking mark of the first exposure area.

The calibration apparatus also includes a processing module configured to calculate first calculated values of the first checking marks of the remaining exposure areas according to the first exposure value and a standard file. The illumination device is adjusted by an adjustment device of the lithography apparatus according to the first calculated values during a lithography process.

In some embodiments, an adjustment method for an illumination device of a lithography apparatus is provided. The adjustment method includes positioning a substrate with a patterned layer onto a wafer carrier, and the patterned layer includes exposure areas, and each of the exposure areas includes a checking mark.

The adjustment method also includes obtaining an exposure value of one of the checking marks of a first exposure area of the exposure areas by measuring the one of the checking marks. The adjustment method also includes calculating a number of calculated values of the checking marks according to the exposure value and a standard file, and adjusting the illumination device according to the calculated values during a lithography process.

In some embodiments, an adjustment method for an illumination device of a lithography apparatus is provided. The adjustment method includes positioning a substrate with a patterned layer onto a wafer carrier, and the patterned layer includes exposure areas, and each of the exposure areas includes a first checking mark and a second checking mark. The adjustment method also includes obtaining a first exposure value of the first checking mark of a first exposure area of the exposure areas by measuring the first checking mark of the first exposure area.

The adjustment method also includes calculating first calculated values of the first checking marks of remaining exposure areas of the exposure areas according to the first exposure value and a standard file. The adjustment method also includes obtaining a second exposure value of the second checking mark of a second exposure area of the exposure areas by measuring the second checking mark of the second exposure area.

The adjustment method also includes calculating second calculated values of the second checking marks of the remaining exposure areas according to the second exposure value and the standard file. The adjustment method also includes adjusting a first adjusting lens of the illumination device according to the first calculated values, and adjusting a second adjusting lens of the illumination device according to the second calculated values during a lithography process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A calibration apparatus for adjusting an illumination device of a lithography apparatus, the calibration apparatus comprising:
    a wafer carrier configured to support a substrate with a patterned layer, wherein the patterned layer comprises a first exposure area, a second exposure area and a plurality of remaining exposure areas, and each of the first, the second and the remaining exposure areas comprises a first checking mark and a second checking mark;
    a measurement device configured to obtain a first exposure value of the first checking mark of the first exposure area by measuring the first checking mark of the first exposure area, and a second exposure value of the second checking mark of the second exposure area by measuring the second checking mark of the second exposure area; and
    a processing module configured to calculate a plurality of first calculated values of the first checking marks of the remaining exposure areas according to the first exposure value and a standard file, and a plurality of second calculated values of the second checking marks of the first and the remaining exposure areas according to the second exposure value and the standard file,
    wherein the illumination device is adjusted by an adjustment device of the lithography apparatus according to the first calculated values during a lithography process.

2. The calibration apparatus as claimed in claim 1, wherein the standard file comprises a plurality of first standard values corresponding to the first checking marks, and the processing module is configured to calculate the first calculated values of the first checking marks of the remaining exposure areas according to the first exposure value and the first standard values.

3. The calibration apparatus as claimed in claim 2, wherein the first standard values are obtained by measuring a plurality of first standard marks of a standard wafer.

4. The calibration apparatus as claimed in claim 1, wherein the lithography apparatus further comprises a light source configured to emit a light beam to the wafer via the illumination device and a photomask when the wafer is processed by the lithography apparatus.

5. The calibration apparatus as claimed in claim 1, wherein the standard file comprises a plurality of first standard values corresponding to the first checking marks and a plurality of second standard values corresponding to the second checking marks,
    wherein the processing module is configured to calculate the first calculated values of the first checking marks of the remaining exposure areas according to the first exposure value and the first standard values, and calculate the second calculated values of the second checking marks of the first and the remaining exposure areas according to the second exposure value and the second standard values.

6. The calibration apparatus as claimed in claim 5, wherein the first standard values are obtained by measuring a plurality of first standard marks of a standard wafer, and the second standard values are obtained by measuring a plurality of second standard marks of the standard wafer.

7. The calibration apparatus as claimed in claim 5, wherein the illumination device comprises a first adjusting lens and a second adjusting lens, the first adjusting lens is adjusted by the adjustment device according to the first calculated values during the lithography process, and the second adjusting lens is adjusted by the adjustment device according to the second calculated values during the lithography process.

8. The calibration apparatus as claimed in claim 7, wherein the adjustment device is configured to move the first or the second adjusting lens along a horizontal plane or a vertical direction, or rotate the first or the second adjusting lens.

9. The calibration apparatus as claimed in claim 7, wherein the lithography apparatus further comprises a light source configured to emit a light beam to the wafer via the first and the second lens and a photomask when the wafer is processed by the lithography apparatus.

10. An adjustment method for an illumination device of a lithography apparatus, comprising:
    positioning a substrate with a patterned layer onto a wafer carrier, wherein the patterned layer comprises a plurality of exposure areas, and each of the exposure areas comprises a checking mark;
    obtaining an exposure value of one of the checking marks of a first exposure area of the exposure areas by measuring the one of the checking marks; and
    calculating a plurality of calculated values of the checking marks according to the exposure value and a standard file;
    adjusting the illumination device according to the calculated values during a lithography process,
    wherein the standard file comprises a plurality of standard values corresponding to the checking marks, a difference value is obtained by the exposure value minus the standard value corresponding to the first exposure area, and each of the calculated values of remaining exposure areas of the exposure areas are obtained by the difference value plus one of the standard values corresponding to the remaining exposure areas.

11. The adjustment method as claimed in claim 10, wherein the lithography apparatus further comprises a light source configured to emit a light beam to the wafer via the illumination device and a photomask when the wafer is processed by the lithography apparatus.

12. The adjustment method as claimed in claim 10, further comprising measuring a plurality of standard marks of a standard wafer to generate the standard file, and each of the standard marks corresponds to one of the checking marks.

13. An adjustment method for an illumination device of a lithography apparatus, comprising:

positioning a substrate with a patterned layer onto a wafer carrier, wherein the patterned layer comprises a plurality of exposure areas, and each of the exposure areas comprises a first checking mark and a second checking mark;

obtaining a first exposure value of the first checking mark of a first exposure area of the exposure areas by measuring the first checking mark of the first exposure area;

calculating a plurality of first calculated values of the first checking marks of a plurality of remaining exposure areas of the exposure areas according to the first exposure value and a standard file;

obtaining a second exposure value of the second checking mark of a second exposure area of the exposure areas by measuring the second checking mark of the second exposure area;

calculating a plurality of second calculated values of the second checking marks of the remaining exposure areas according to the second exposure value and the standard file; and adjusting a first adjusting lens of the illumination device according to the first calculated values, and adjusting a second adjusting lens of the illumination device according to the second calculated values during a lithography process.

14. The adjustment method as claimed in claim 13, wherein the standard file comprises a plurality of first standard values corresponding to the first checking marks and a plurality of second standard values corresponding to the second checking marks, wherein the first calculated values are calculated according to the first exposure value and the first standard values, and the second calculated values are calculated according to the second exposure value and the second standard values.

15. The adjustment method as claimed in claim 14, wherein the standard file comprises a plurality of first standard values corresponding to the first checking marks, and a plurality of second standard values corresponding to the second checking marks, wherein a first difference value is obtained by the first exposure value minus the first standard value corresponding to the first exposure area, and each of the first calculated values corresponding to the remaining exposure areas are obtained by the first difference value plus one of the first standard values corresponding to the remaining exposure areas, wherein a second difference value is obtained by the second exposure value minus the second standard value corresponding to the second exposure area, and each of the second calculated values corresponding to the remaining exposure areas are obtained by the first difference value plus one of the second standard values corresponding to the remaining exposure areas.

16. The adjustment method as claimed in claim 13, wherein the lithography apparatus further comprises a light source configured to emit a light beam to the wafer via the first and the second adjusting lenses and a photomask when the wafer is processed by the lithography apparatus.

17. The adjustment method as claimed in claim 13, further comprising measuring a plurality of first standard marks and a plurality of second standard marks of a standard wafer to generate the standard file, wherein each of the first standard marks corresponds to one of the first checking marks, and each of the second standard marks corresponds to one of the second checking marks.

* * * * *